US007027854B2

(12) United States Patent
Fuderer et al.

(10) Patent No.: US 7,027,854 B2
(45) Date of Patent: Apr. 11, 2006

(54) MAGNETIC RESONANCE IMAGING UTILIZING A MICROCOIL

(75) Inventors: Miha Fuderer, Eindhoven (NL); Johannes Jacobus Van Vaals, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 498 days.

(21) Appl. No.: 09/980,176

(22) PCT Filed: Mar. 28, 2001

(86) PCT No.: PCT/EP01/03560

§ 371 (c)(1),
(2), (4) Date: Nov. 29, 2001

(87) PCT Pub. No.: WO01/73460

PCT Pub. Date: Oct. 4, 2001

(65) Prior Publication Data

US 2002/0165449 A1 Nov. 7, 2002

(51) Int. Cl.
*A61B 5/055* (2006.01)

(52) U.S. Cl. ....................... 600/419; 600/420; 600/423; 324/309

(58) Field of Classification Search ................. 600/424, 600/423, 419, 420; 324/309, 306
See application file for complete search history.

(56) References Cited

U.S. PATENT DOCUMENTS

| | | | | |
|---|---|---|---|---|
| 5,162,736 A | * | 11/1992 | Mansfield et al. | 324/309 |
| 5,307,808 A | | 5/1994 | Dumoulin et al. | 128/653.2 |
| 5,715,822 A | | 2/1998 | Watkins et al. | 128/653.5 |
| 5,938,599 A | | 8/1999 | Rasche et al. | 600/410 |
| 6,397,094 B1 | * | 5/2002 | Ludeke et al. | 600/411 |

FOREIGN PATENT DOCUMENTS

EP 0731362 9/1996

OTHER PUBLICATIONS

Leung et al., "Intravascular MR Tracking Catheter: Preliminary Experimental Evaluation," 1995, pp. 1265–1270.
Coutts et al., "Integrated Position Tracking And Imaging Of Interventional Tools And Internal Devices using Small Fiducial Receiver Coils," Apr. 12, 1997, p. 1924.

* cited by examiner

*Primary Examiner*—Shawna J. Shaw

(57) ABSTRACT

An interventional magnetic resonance method and apparatus utilizing a microcoil which enable localization of an interventional instrument by detecting magnetic resonance signals from the surroundings of the microcoil under the influence of magnetic field gradients. The outstanding reliability and the high speed of the method are due to the application of spatially non-selective RF pulses in conjunction with a sequence of gradient pulses in non-colinear directions. The localization method can be used inter alia for angiography wherein the signal intensity is used to determine the amount of blood present in the blood vessel.

22 Claims, 4 Drawing Sheets

3/4

MAGNETIC RESONANCE IMAGING UTILIZING A MICROCOIL

The invention relates to a magnetic resonance method for localizing an interventional instrument on which at least one microcoil is provided, first a magnetic resonance signal being generated in an examination zone by means of an RF pulse, said magnetic resonance signal subsequently being detected via the microcoil and under the influence of magnetic field gradients. The invention also relates to a method of reproducing blood vessels (angiography) in which a catheter, on which at least one microcoil is provided for the detection of spin resonance signals, is inserted into the blood vessel of a patient to be examined, and also to a diagnostic magnetic resonance imaging method for imaging the surroundings of an interventional instrument on which a microcoil is provided for the detection of the magnetic resonance signals. The invention also relates to a magnetic resonance system for carrying out such a method.

The localization of interventional instruments is important in medicine, that is, for diagnostic as well as for therapeutic methods. Such instruments may be, for example catheters, biopsy needles, minimal invasive surgical instruments or the like. For most therapeutic treatment methods, however, the determination of the position of an interventional instrument alone is not adequate; it is also very desirable to know the local anatomy in the direct vicinity of the instrument as accurately as possible. An important application of interventional radiology is formed by angiography which serves to find out the anatomical details of the vascular system of a patient. The localization and diagnosis of stenoses is of particular importance, that is, constrictions of the blood vessels that are caused by deposits. X-ray angiography, being based on the attenuation of the X-rays by an iodine contrast medium, is routinely used for the diagnosis of constrictions of vessels. Recently, however, angiography methods based on magnetic resonance tomography are becoming more and more important. In comparison with X-ray diagnosis magnetic resonance offers the major advantage of significantly better tissue selectivity. Magnetic resonance tomography enables not only the imaging of the vascular system of a patient, and possibly the localization of stenoses, but also a detailed, qualitative examination of the walls of the vessels and the surrounding tissue. The exact information concerning the condition of deposits in blood vessels provides important data for the selection of a suitable therapy.

Recently magnetic resonance techniques have become known in which a microcoil is arranged on an interventional instrument in order to detect magnetic resonance signals. Methods for the magnetic resonance imaging of blood vessels by means of an intravascular catheter whose tip is provided with such a microcoil are of special interest. A problem encountered in such magnetic resonance angiography methods, however, is due to the small spatial sensitivity range of the microcoil that has dimensions of a few millimeters only. Such a coil is capable of detecting signals from the immediate surroundings only. Therefore, the coil should preferably be constructed in such a manner that the sensitive volume corresponds to the typical diameter of human blood vessels. For effective and fast magnetic resonance imaging of the surroundings of the coil it is necessary to determine the position of the microcoil in the body of the patient as accurately as possible. The aim is to image the course of a vessel of interest quickly while detecting and localizing stenoses or injuries in a reliable manner.

U.S. Pat. No. 5,938,599 proposes a magnetic resonance method for the tracking and monitoring of the movement of an interventional instrument provided with a microcoil. The spectrum of the magnetic resonance signal from the surroundings of the microcoil is analyzed for the purpose of localization. The frequency of the signal is determined by magnetic field gradients that act on the examination zone in conformity with the known method. After the selective excitation of a slice in which the microcoil is situated, first a co-ordinate of the instantaneous position is determined. Subsequently, a one-dimensional, line-shaped image is formed of the volume containing the microcoil. The method is based essentially on spatially selective RF pulses for the excitation or the refocusing of the nuclear magnetization. The conventional, external RF coils of conventional magnetic resonance tomography apparatus are used for the actual imaging of the surroundings of the microcoil.

The known magnetic resonance method has a series of significant drawbacks: because a high spatial resolution is pursued for the localization of the microcoil, correspondingly high requirements are imposed as regards the RF pulses and the gradient pulses. It cannot be assumed that a major part of the magnetic resonance tomography apparatus being used at present can satisfy these requirements. In order to carry out the method it is of decisive importance that the movement of the interventional instrument is not too fast, because the microcoil is otherwise moved out of the excitation zone beyond which a signal can no longer be detected. When a high spatial resolution is desired, the interventional instrument can be moved only very slowly within the patient. The large number of excitation pulses and refocusing pulses required for the known method burden the patient to a high degree. A further drawback is based on the fact that the image reconstruction of the surroundings of the interventional instrument from the individual, one-dimensional line-like sub-images is extremely complex and does not conform to standard type image reconstruction methods customarily used in magnetic resonance tomography.

Therefore, it is an object of the present invention to provide a method for localizing an interventional instrument with a microcoil which avoids the described drawbacks to a high degree. The aim is to enable reliable determination of the position while the microcoil may be present in an arbitrary location in the examination zone.

This object is achieved by a magnetic resonance method of the kind set forth in that, after application of the non-selective RF pulse, two or more gradient pulses having a respective linearly independent spatial direction are generated in temporal succession, the position of the microcoil in the relevant spatial direction being determined from the frequency of the magnetic resonance signal during each gradient pulse.

The initial, non-selective RF pulse excites nuclear magnetization in the entire examination zone in which the microcoil may be present. The associated magnetic resonance signal is then detected via the microcoil and under the influence of a sequence of gradient and, if necessary, RF pulses. Because of its small spatial sensitivity range, whose diameter typically amounts to only a few millimeters, magnetic resonance signals are then detected only from the immediate surroundings. Under the influence of the magnetic field gradient, therefore, the spectrum of the detected signal is very narrow and contains essentially only a single frequency component which can be directly associated with the position of the microcoil in the spatial direction determined by the gradient pulse. When a series of two or three gradient pulses is applied in linearly independent, for example, orthogonal spatial directions, the position of the coil is thus sequentially obtained.

The pulse sequence in accordance with the invention is preferably extremely short, so that it can be repeated at short time intervals in order to enable continuous tracking of the position of the microcoil, for example during a surgical intervention. In this context it may be useful to select the excitation angle of the non-selective RF pulse to be as small as possible while taking into account the relevant requirements imposed on the sensitivity. The localization of the microcoil by means of the method in accordance with the invention is reliable, irrespective of the speed at which the interventional instrument is moved. This is due to the fact that, as opposed to the previously described known method, the selection of a slice is dispensed with at the beginning of the sequence. A further advantage resides in the fact that the localization of the coil can be performed completely without imaging steps. The data processing required for the determination of the position is very insignificant; this again benefits the speed.

It may be advantageous to perform the localization in accordance with the present invention, wherein after the non-selective RF pulse the two or more gradient pulses are applied in temporal succession without intermediate application of further RF pulses.

Because the sensitivity of the microcoil is limited to its immediate surroundings the spectrum of the magnetic resonance signal is so narrow that the nuclear magnetization contributing to the detected signal in the vicinity of the microcoil is dephased only comparatively slowly, that is, even in the presence of magnetic field gradients. Therefore, the signal can be readily detected during the series of gradient pulses, without intermediate renewed excitation or refocusing by further RF pulses being necessary. Thus the duration of the localization sequence of the present invention is further reduced.

It is also an object of the invention to provide a magnetic resonance angiography method whereby stenoses can be reliably and quickly detected and diagnosed.

This object is achieved by an angiography method where a catheter which is provided with at least one microcoil for the detection of magnetic resonance signals is inserted into the blood vessel of a patient to be examined and the position of the catheter is detected by means of the previously described localization method in accordance with the invention, the intensity of the detected magnetic resonance signal being reproduced as a function of the catheter position.

As has already been described, the operation of the localization method according to the invention is fast and reliable so that the position of the catheter can be continuously determined while the catheter is being advanced in a blood vessel. The entire course of the blood vessel in the body of the patient can thus be reproduced, without necessitating imaging steps and image reconstruction steps that require much calculation work. The intensity of the magnetic resonance signal is proportional to the spin density in the vicinity of the microcoil. The spin density itself is determined essentially by the amount of blood present at the position of the microcoil. The blood volume at the relevant location is reduced in the presence of a stenosis restricting the blood vessel. This leads to a reduced intensity of the magnetic resonance signal. The intensity of the magnetic resonance signal thus constitutes a simple indicator for determining the volume of the blood vessel so as to trace stenoses. Because the signal intensity is represented in association with the catheter position in the blood vessel, the presence of vessel constrictions and their exact location within the patient are made directly visible. It follows directly from the foregoing that the microcoil used should be constructed in such a manner that the spatial sensitivity range corresponds approximately to the diameter of human blood vessels. For the diagnosis of large vessels, therefore, the microcoil should be capable of dealing with a volume of a few millimeters.

The angiography method according to the invention can be advantageously used in conjunction with known therapeutic methods. For example, the position of a stenosis thus determined can be used to position a dilatation bulb exactly in the relevant location. It may then be particularly advantageous to relate the position of the stenosis to the inserted length of the catheter used. The correct position for dilatation is then reached by inserting the bulb catheter exactly as far as previously the catheter with the microcoil.

For the angiography method according to the invention it is advantageous to increase the spin lattice relaxation rate in the blood surrounding the microcoil by utilizing a suitable contrast medium. This enables the localization sequence to be repeated so quickly, and with adequate sensitivity, that continuous tracking of the catheter is possible. The repeats can notably take place at such short time intervals that the signal contributions from the tissue that surrounds the blood vessel and has a comparatively small spin lattice relaxation rate, become negligibly small because of saturation. The method according to the invention thus becomes sensitive exclusively to the blood present in the vessel. The localization of stenoses thus becomes significantly more reliable, because otherwise the tissue contributions at the area of constrictions would undesirably contribute to the magnetic resonance signal.

However, notably at the area of stenoses it may also be advantageous to perform a more exact examination of the surrounding tissue. For example, the magnetic resonance signal from the surroundings of the microcoil can be spectroscopically analyzed so as to extract information concerning the chemical composition and condition of the vessel walls.

It is also feasible to derive the flow speed of the blood surrounding the microcoil from the magnetic resonance signal. Suitable so-called flow encoding methods, usually utilizing a flow-dependent echo attenuation, have since long been known and can be applied so as to diagnose stenoses via the flow speed of the blood that is higher at the relevant location.

Furthermore, it is also advantageously possible to carry out conventional volume imaging of the examination zone in parallel with the angiography method according to the invention. The course of the vessel and the location of a stenosis, if any, can be related to the anatomy of the patient by reproducing the intensity of the magnetic resonance signal as a function of the position of the catheter in an anatomical survey image of the examination zone.

It is also an object of the invention to provide an imaging magnetic resonance method that enables imaging of the surroundings of an interventional instrument The method should be particularly fast and reliable so as to enable direct tracking of the motion of the instrument. Moreover, it should be possible to implement the method in customary magnetic resonance tomography apparatus.

This object is achieved by a diagnostic magnetic resonance imaging method for imaging the surroundings of an interventional instrument provided with a microcoil in that a localization sequence, preferably as described herein before, is applied in alternation with a sequence of RF pulses and gradient pulses that is intended for imaging, the parameters of the imaging sequence that determine the volume to be imaged, that is, the so-called field of view (FOV), being predetermined by the position of the interventional instrument that has been determined by way of the localization method, so that an image of the surroundings of the interventional instrument is formed. It is noted that the technical measure of the alternation of the localization sequence and the sequence of RF pulses and gradient pulses that is intended for imaging can be applied independently of the particular localization sequences described above.

According to the customary imaging magnetic resonance methods the FOV and the relevant spatial resolution are predetermined by the excitation pulses as well as by the number, the strength, the duration and the sequence of the gradient pulses intended for frequency and phase encoding. The sampling of the k space is defined by these parameters, the FOV being customarily selected by the user of the tomography apparatus as desired for the relevant diagnostic task. According to the imaging method in accordance with the invention, however, the parameters determining the FOV are determined automatically by means of the localization method whereby, as described above, the position of the microcoil can be determined within the shortest possible period of time. The microcoil via which the magnetic resonance signal is detected in the imaging method in accordance with the invention has a severely restricted spatial sensitivity range, so that the FOV need cover only a volume in the direct vicinity of the coil. This comparatively small FOV can be imaged with the customarily required resolution within a very short period of time. The localization sequence and the imaging sequence can thus be applied alternately in rapid succession, so that the vicinity of the moving interventional instrument is continuously imaged. The actual volume imaging is performed by means of a customary sequence applied directly subsequent to the localization sequence. Such a combination sequence can be implemented without much work in practically any contemporary magnetic resonance tomography apparatus. This is a major advantage of the invention over the known technique, which involves a very specific and complex imaging procedure with a limited suitability in practice.

Preferably, the FOV should be selected so as to be slightly larger than the spatial sensitivity range of the microcoil, because otherwise undesirable image artefacts would occur. Such so-called aliasing effects are due to inadequate sampling of the k space.

A so-called "echo voluminar imaging" (EVI) sequence constitutes an imaging sequence that can be readily implemented for the required reproduction of a small FOV with only a single RF pulse. It deviates from the better known "echo planar imaging" (EPI) sequence merely in that sampling takes place in a further direction in the k space. Volume images of the surroundings of the microcoil with a resolution of, for example, 64×16×16 voxels can be acquired approximately every 50 ms without any problem. Thus, an image rate of 20 images per second is obtained; this is adequate for the tracking of an interventional instrument.

Single images of the surroundings of the interventional instrument can be advantageously superposed on an anatomical survey image of the examination zone that has been acquired by means of external RF coils. The instantaneous FOV can thus be related to the anatomy of the patient examined.

It is also advantageous to combine the small volume images, acquired in the course of time during the motion of the interventional instrument, so as to form an overall image. There are methods (so-called "synergy coil combination" algorithms) that are suitable for combining magnetic resonance signals that have been picked up by different coils with each time a different spatial sensitivity profile into an overall image. Algorithms of this kind can be used for the imaging method in accordance with the present invention so as to combine the sequentially acquired data into one image, because in the course of time the interventional instrument with the microcoil provided thereon is moved so that the position in space of the sensitive area changes. This is considered to be directly analogous to the previously mentioned "synergy coil" problems. The difference consists merely in that the magnetic resonance signals are not picked up by different coils, but by the same coil that is present in different positions at different times.

In conjunction with the foregoing, for further acceleration of the method according to the invention it is advantageous to select the FOV of the individual imaging sequence so as to be smaller than the spatial sensitivity zone of the microcoil, so that image artefacts caused by so-called aliasing effects are eliminated by combination of the magnetic resonance signals successively acquired in different positions while taking into account the spatial sensitivity profile of the microcoil. The number of sampling points in the k space can thus be significantly reduced, so that a significant saving in time is obtained, enabling a larger number of images to be acquired per time interval. Methods for the reconstruction of images from magnetic resonance signals picked up in parallel by coils having different spatial sensitivity profiles with a reduced FOV are now known as "SENSE" (sensitivity encoding) methods. These methods utilize the spatial information, contained in the magnetic resonance signals due to the relevant sensitivity profile of the coil used, so as to reconstruct the complete image also in the case of insufficient sampling of the k space. SENSE can also be used for the data sequentially acquired according to the invention while offering a corresponding increase of the image rate.

It is advantageous to add a further imaging sequence to the succession of localization sequence and imaging sequence, the FOV of said further imaging sequence also being situated in the vicinity of the interventional instrument and the magnetic resonance signals being detected by an external volume coil or surface coil. The spatial sensitivity profile of the microcoil, which must be known exactly so as to enable application of the previously described SENSE method, can then be determined by comparing the data acquired by means of the microcoil with the data from the external coil.

The methods described thus far can be carried out by means of a magnetic resonance system which includes at least one coil for generating a uniform, steady magnetic field, a number of gradient coils for generating gradient pulses in different spatial directions, an RF transmission coil for generating RF pulses, at least one control unit for controlling the temporal succession of RF pulses and gradient pulses, a reconstruction unit and a visualization unit, and an interventional instrument with at least one microcoil which is connected to a receiving unit, the control unit being used to generate, via the RF transmission coil, a non-selective RF pulse and, via the gradient coils, gradient pulses with respective linearly independent spatial directions, the magnetic resonance signals detected by the microcoil being received via the receiving unit in order to calculate therefrom, by means of the reconstruction unit, the position of the interventional instrument that can be displayed by means of the visualization unit.

When the magnetic resonance system is to be used for imaging in accordance with the invention, the control unit should preferably be capable of additionally generating an imaging sequence whose FOV can always be automatically adjusted to the region of the previously determined position of the interventional instrument.

For the conversion of the SENSE method the reconstruction unit in the magnetic resonance system in accordance with the invention can be utilized to combine, during the imaging, the magnetic resonance signals collected in different positions of the interventional instrument while taking into account the spatial sensitivity profile of the microcoil, thus forming an image of the surroundings of the interventional instrument, for display by means of the visualization unit.

Furthermore, it is advantageous to provide the magnetic resonance system with at least one additional external volume coil or surface coil that is intended for the reception of magnetic resonance signals during the formation of anatomical survey images which are displayed by the visualization unit, together with the detected position of the interventional instrument.

The method in accordance with the invention can be advantageously carried out in most magnetic resonance systems in clinical use at present. To this end it is merely necessary to utilize a computer program that determines the spectrum of the magnetic resonance signals detected by the microcoil and calculates the position of the interventional instrument therefrom on the basis of the gradient pulses used; this position is displayed on the visualization unit. The computer program can be present either on a data carrier or be presented in a data network so as to be fetched for installation in a magnetic resonance system. Such a computer program can be used to the same extent for the imaging method in accordance with the invention in that, using the position data determined, it calculates the parameters of a suitable imaging frequency determining the FOV.

Embodiments of the invention will be described in detail hereinafter with reference to the drawings. Therein:

FIG. 1 is a diagrammatic cross-sectional view of a patient and an angiography catheter inserted in a blood vessel to be examined;

FIG. 2*a* shows a pulse sequence for localizing an interventional instrument with a microcoil;

FIG. 2*b* shows an alternative localization pulse sequence;

Figure 1:
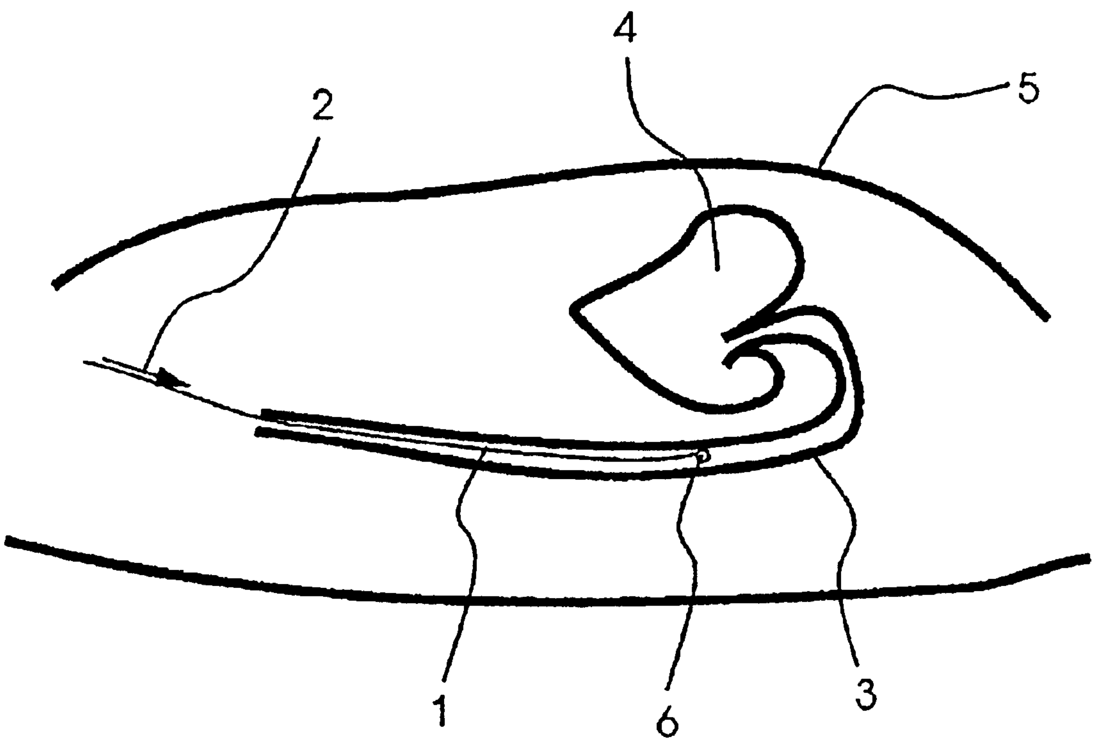

FIG. 1 shows a catheter 1 which is displaced in a direction 2 in a blood vessel 3 of interest. This may be, for example, a blood vessel emanating from the heart 4 of a patient 5, for example the aorta abdominalis. At the end of the catheter 1 there is provided a microcoil 6 for use in accordance with the invention.

Figure 2A:
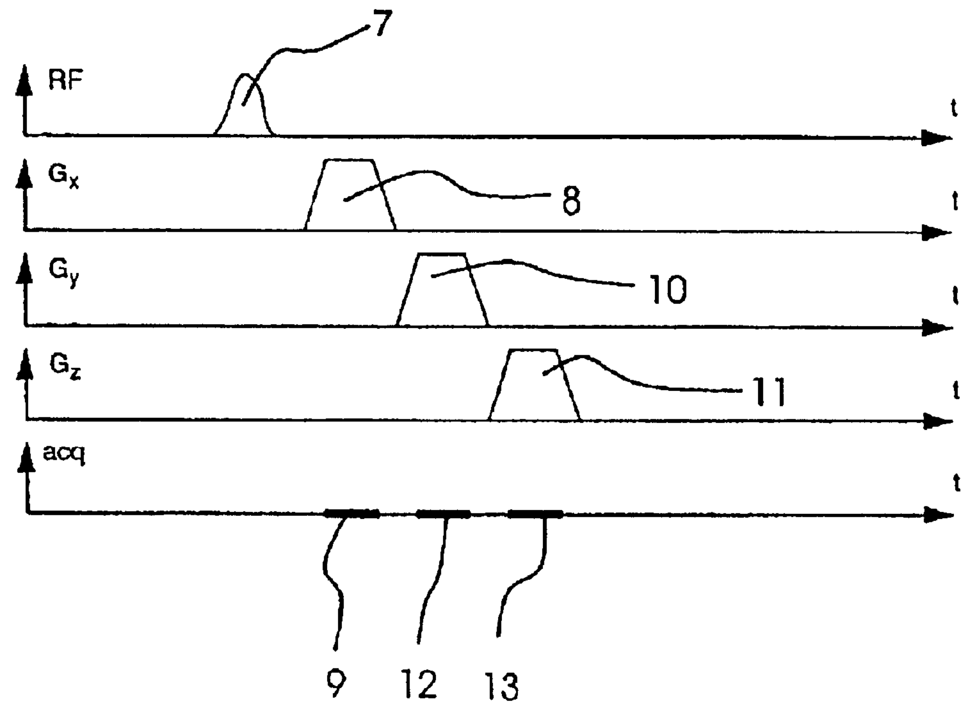
Figure 2B:
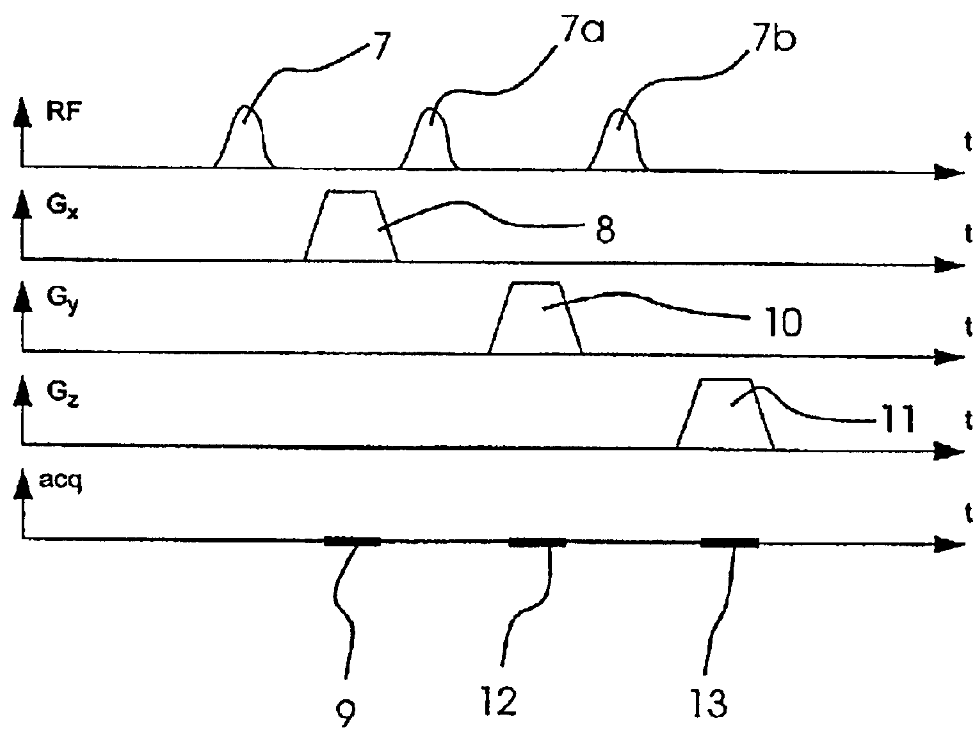

The diagram shown in FIG. 2*a* illustrates the execution in time of the sequence in accordance with the invention for the localization of the microcoil provided on an interventional instrument. The upper line shows that the sequence commences with an RF pulse 7 which is not selective, so that magnetization is excited in the entire examination zone. The RF pulse is succeeded by a first gradient pulse 8 which is shown on the next line. The diagrams of the second, the third and the fourth line represent the current through various gradient coils as a function of time. The first gradient pulse 8 concerns a gradient that is applied in the x direction and ensures that the nuclear magnetization in the vicinity of the microcoil performs a precessional motion at a frequency which is directly proportional to the corresponding x co-ordinate. The associated magnetic resonance signal that is induced in the microcoil is then collected for the duration of the first gradient pulse 8. The time intervals in which the data acquisition takes place are shown on the last line of the diagram. The data acquisition for the determination of the x co-ordinate of the microcoil thus takes place in a time interval 9. The x gradient pulse is succeeded by a y gradient 10 and a z gradient 11 which are associated with the time intervals 12 and 13 for data acquisition. During the time intervals 9, 12 and 13 the signal has frequencies wherefrom the x, y and z co-ordinates of the microcoil can be derived directly, for example, by Fourier transformation. The position of the interventional instrument whereto the microcoil is attached is thus completely determined. The alternative sequence as shown in FIG. 2*b* comprises two further RF pulses 7*a* and 7*b* which are irradiated between the data acquisition intervals 9, 12, and 13 respectively. The RF pulses 7*a* and 7*b* serve as refocusing pulses in order to create echo signals for data acquisition with an optimal signal to noise ratio. This makes the method of the invention applicable even if the magnetic resonance signal dephases rapidly due to strong gradients, which can be applied to obtain a high spatial resolution during the localization of the microcoil.

Figure 3:
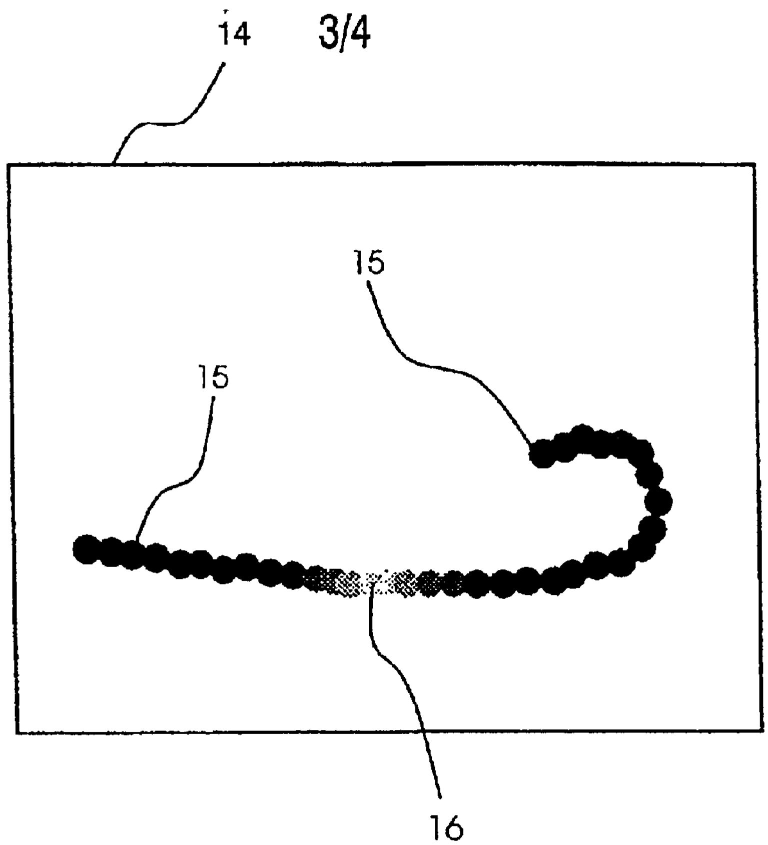
FIG. 3 shows a blood vessel in conformity with the angiography method in accordance with the invention.
Figure 4:
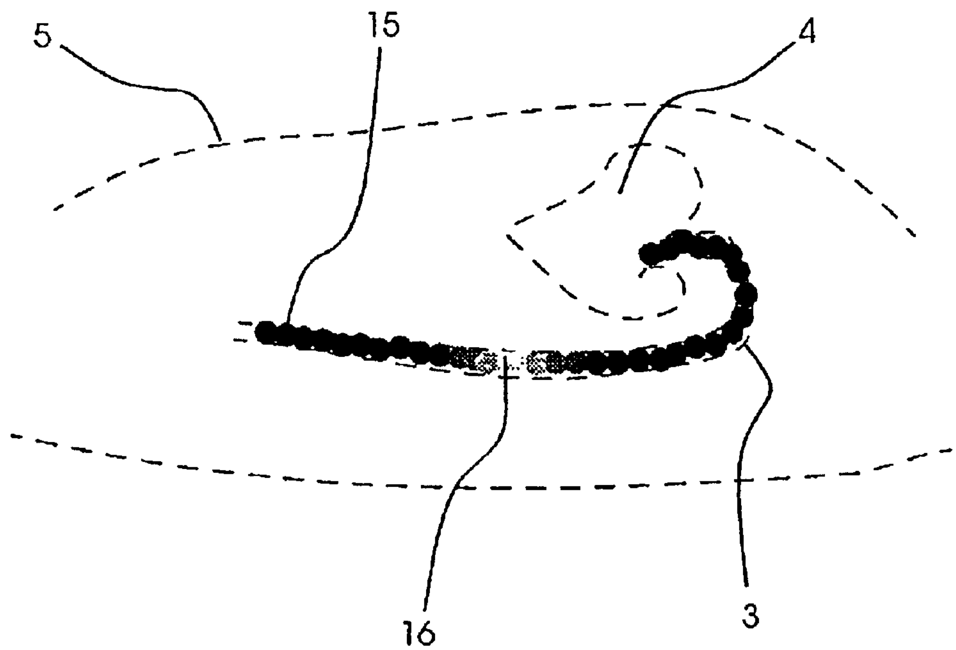
FIG. 4 shows an angiographic representation superimposed on an anatomical survey image.

FIG. 3 shows the intensity of the magnetic resonance signal detected by the microcoil as a function of the position determined in an examination zone 14. During the progression of the catheter 1 in the blood vessel 3 of interest the position of the microcoil is repeatedly determined. Each position is represented by a dot in FIG. 3. The color of the dots corresponds to the intensity of the magnetic resonance signal. A dark dot 15 means a high signal intensity whereas a bright dot 16 means a correspondingly lower signal intensity. As has already been described, the signal intensity is proportional to the amount of blood surrounding the microcoil. The low intensity of the point 16 thus forms an indication of a constriction of the blood vessel. In conformity with this angiography method an image of the course of the vessel of interest is obtained without any imaging steps being necessary. However, for example, the stenosis found in the location 16 can be only poorly related to the anatomy of the patient in this manner. Therefore, it makes sense to superimpose the image obtained by means of the angiography method in accordance with the invention (as shown in FIG. 4) on an anatomical survey image showing the patient 5 together with the blood vessel 3 and the heart 4. The vessel wherein the stenosis found is situated and its anatomical position can thus be seen directly. One of the basic ideas of the invention is to allow for a continuous motion of the catheter 1 during a rapid repetition of a basic localization sequence. Typical advancing speeds of the catheter of up to 10 centimeters per second can be envisaged. The motion during application of the basic localization sequence shown in FIG. 2*a* or 2*b* is negligible as compared to the size of the sensitive volume of the microcoil. For a relevant length of a vessel (50 centimeters) about 5000 measurements would be obtained during 5 seconds of motion. Even if the catheter 1 "rests" for some reason during that time, the continuously acquired data are just redundant data which do not affect the angiographic examination method of the invention.

Figure 5:
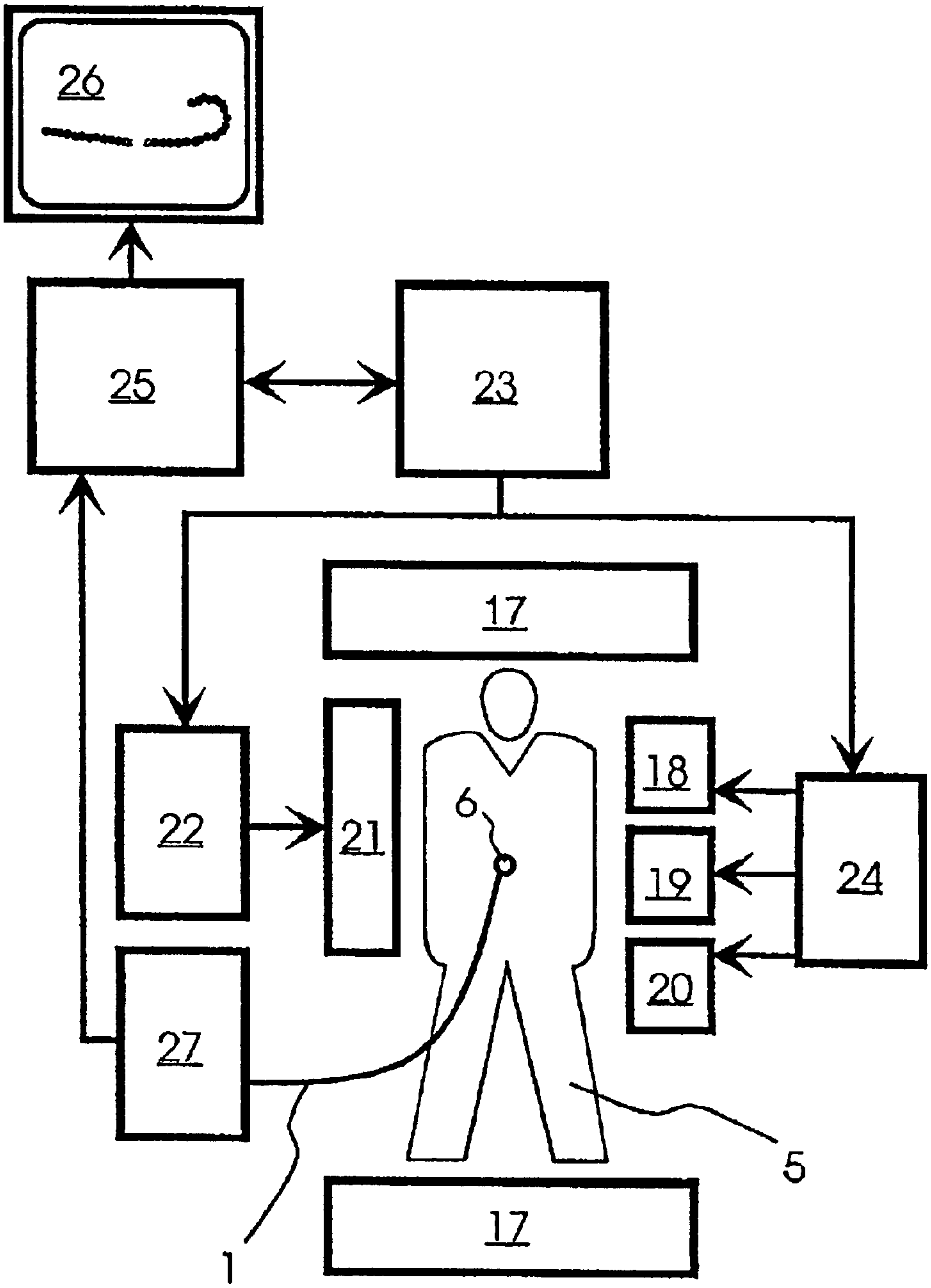
FIG. 5 shows a block diagram of a magnetic resonance system according to the invention.

A magnetic resonance system as shown in FIG. 5 is suitable for carrying out the method in accordance with the invention. It includes a coil 17 for generating a steady, uniform magnetic field, gradient coils 18, 19 and 20 for generating gradient pulses in the x, the y and the z direction, and an RF transmission coil 21. The temporal succession of the gradient pulses is controlled by a control unit 23 which communicates with the gradient coils 18, 19 and 20 via a gradient amplifier 24. Furthermore, the control unit is connected to the transmission coil 21 via an RF transmission amplifier 22, so that powerful RF pulses can be generated. The system also includes a reconstruction unit 25 in the form of a microcomputer as well as a visualization unit which may be a graphic monitor 26. The microcoil 6 is provided on the tip of the catheter 1 that is inserted into the patient 5. The microcoil 6 is connected, via the catheter 1, to a receiving unit 27 via which the detected signals are possibly demodulated and applied to the reconstruction unit 25. In the reconstruction unit 25, the spin resonance signals are subjected to Fourier analysis so that the microcoil 6 can be localized while taking into account the applied gradients. The calculated position of the catheter 1 is then displayed on the monitor 26, possibly as shown in FIGS. 3 and 4. The reconstruction unit 25 is connected to the control unit 23 so that the position data determined for the imaging method in accordance with the invention can possibly be used for further purposes.

What is claimed is:

1. A magnetic resonance method for localizing an interventional instrument on which at least one microcoil is provided, comprising the steps of:

generating a magnetic resonance signal in an examination zone by means of a single non-selective RF pulse, detecting said magnetic resonance signal via the microcoil and under the influence of magnetic field gradients, said detecting step comprising the steps of generating two or more gradient pulses having a respective linearly independent spatial direction in temporal succession without intermediate application of further RF pulses between temporally adjacent gradient pulses, and determining the position of the microcoil in the relevant spatial direction from the frequency of the magnetic resonance signal during each gradient pulse.

2. A magnetic resonance system for carrying out the method claimed in claim 1, which system comprises:

at least one coil for generating a uniform, steady magnetic field, a number of gradient coils for generating gradient pulses in different spatial directions, an RF transmission coil for generating RF pulses, at least one control unit for controlling the temporal succession of RF pulses and gradient pulses, a reconstruction unit, a visualization unit, a receiving unit, and an interventional instrument with at least one microcoil which is connected to the receiving unit, wherein:

the at least one control unit being arranged to generate, via the RF transmission coil, non-selective RF pulses and, via the gradient coils, the two or more gradient pulses with respective linearly independent spatial directions, and the magnetic resonance signals detected by the at least one microcoil being received via the receiving unit, in order to calculate therefrom, by means of the reconstruction unit, the position of the interventional instrument which is displayed on the visualization unit.

3. A computer program product contained on a computer-readable medium for a magnetic resonance system as claimed in claim 2, wherein the computer program determines the spectrum of the magnetic resonance signals detected by the microcoil and calculates therefrom, and on the basis of the gradient pulses used, the position of the interventional instrument for display by means of the visualization unit.

4. A computer program product contained on a computer-readable medium as claimed in claim 3, wherein the parameters of an imaging sequence that determine the FOV are calculated from the position data determined.

5. A magnetic resonance system as claimed in claim 2, wherein the at least one control unit is also arranged to generate an imaging sequence whose FOV can always be automatically adjusted to the area of the position of the interventional instrument.

6. A magnetic resonance system as claimed in claim 5, wherein the reconstruction unit is used during the imaging to combine the magnetic resonance signals sequentially acquired in different positions of the interventional instrument while taking into account the spatial sensitivity profile of the microcoil so as to form an image of the surroundings of the interventional instrument which is displayed by means of the visualization unit.

7. A magnetic resonance system as claimed in claim 2, further comprising at least one additional external volume coil or surface coil which serves to receive magnetic resonance signals during the formation of anatomical survey images that are displayed, together with the position determined for the interventional instrument, by means of the visualization unit.

8. A method of imaging blood vessels, comprising the steps of:

providing a catheter with at least one microcoil, inserting the catheter into the blood vessel of a patient to be examined, detecting the position of the catheter during movement of the catheter, each detection of the position of the catheter comprising generating a magnetic resonance signal in an examination zone by means of a non-selective RF pulse, detecting the magnetic resonance signal via the at least one microcoil and under the influence of magnetic field gradients by generating two or more gradient pulses having a respective linearly independent spatial direction in temporal succession, and determining the position of the at least one microcoil in each spatial direction from the frequency of the magnetic resonance signal during each gradient pulse, and reproducing the intensity of the detected magnetic resonance signal in association with the detected catheter position, said reproducing step comprising the step of variably displaying the intensity of the detected magnetic resonance signal to provide a detected magnetic resonance signal with a higher signal intensity differently than a detected magnetic resonance signal with a lower signal intensity so that the presence and position of a stenosis restricting the blood vessel is visualized since the volume of blood in the blood vessel is indicated by the intensity of the detected magnetic resonance signal.

9. A method as claimed in claim 8, further comprising the step of utilizing a contrast medium to increase the spin lattice relaxation rate in the medium surrounding the microcoil.

10. A method as claimed in claim 8, further comprising the step of repeating the pulse sequence at short time intervals such that the contributions by the tissue surrounding the blood vessel to the magnetic resonance signal are negligibly small.

11. A method as claimed in claim 8, further comprising the step of analyzing the magnetic resonance signal from the surroundings of the microcoil spectroscopically.

12. A method as claimed in claim 8, further comprising the step of determining the flow speed of the blood surrounding the microcoil on the basis of the magnetic resonance signal.

13. A method as claimed in claim 8, wherein the intensity of the magnetic resonance signal is reproduced in an anatomical survey image of the examination zone as a function of the detected position of the catheter.

14. A method as claimed in claim 8, further comprising the step of constructing the at least one microcoil with a spatial sensitivity range corresponding approximately to a diameter of human blood vessel.

15. A method as claimed in claim 8, wherein each time the position of the catheter is detected, the gradient pulses are generated in temporal succession without application of further RF pulses between temporally adjacent gradient pulses.

16. A diagnostic magnetic resonance imaging method for imaging surroundings of an interventional instrument on which a microcoil is provided for the detection of the magnetic resonance signals, comprising the steps of:

applying the localization method as set forth in claim 1 alternately with a sequence of RF pulses and gradient pulses intended for the imaging, and determining the parameters of the imaging sequence that determine the volume to be imaged (field of view or FOV) based on the position of the interventional instrument determined by the localization method so that an image is formed of the surroundings of the interventional instrument.

17. A method as claimed in claim 16, further comprising the step of selecting the volume of the FOV to be larger than the spatial sensitivity range of the microcoil.

18. A method as claimed in claim 16, further comprising the step of using an EVI sequence (echo voluminar imaging) for the imaging.

19. A method as claimed in claim 16, further comprising the step of superposing the image of the surroundings of the interventional instrument on an anatomical survey image of the examination zone.

20. A method as claimed in claim 16, further comprising the step of combining magnetic resonance signals acquired in different positions to form one image of the surroundings of the interventional instrument.

21. A method as claimed in claim 16, further comprising the step of selecting the FOV of the imaging sequence to be smaller than the spatial sensitivity zone of the microcoil so that image artefacts caused by aliasing effects are eliminated by combining magnetic resonance signals successively acquired in different positions while taking into account the spatial sensitivity profile of the microcoil.

22. A method as claimed in claim 16, further comprising the step of extending the succession of the localization sequence and the imaging sequence with a further imaging sequence whose FOV is also situated in the vicinity of the interventional instrument and during which the magnetic resonance signals are detected by an external volume coil or surface coil, the spatial sensitivity profile of the microcoil then being determined by comparison of the data acquired by the microcoil and the data of the external coil.

* * * * *